United States Patent
Smith

(10) Patent No.: US 7,193,458 B2
(45) Date of Patent: Mar. 20, 2007

(54) POWER SUPPLY FOR GUITAR AMPLIFIER

(76) Inventor: Randall C. Smith, 1317 Ross St., Petaluma, CA (US) 94952

( * ) Notice: Subject to any disclaimer, the term of this patent is extended or adjusted under 35 U.S.C. 154(b) by 382 days.

(21) Appl. No.: 10/376,338

(22) Filed: Mar. 3, 2003

(65) Prior Publication Data

US 2003/0169106 A1 Sep. 11, 2003

Related U.S. Application Data

(60) Provisional application No. 60/361,720, filed on Mar. 6, 2002.

(51) Int. Cl.
*H03F 3/28* (2006.01)

(52) U.S. Cl. .................... 330/118; 330/113; 330/165; 330/51

(58) Field of Classification Search ............ 330/118, 330/113, 165, 51; 349/153
See application file for complete search history.

(56) References Cited

U.S. PATENT DOCUMENTS

| | | | | | |
|---|---|---|---|---|---|
| 4,713,624 | A | * | 12/1987 | Smith | 330/118 |
| 4,719,431 | A | * | 1/1988 | Karsten | 330/273 |
| 4,916,599 | A | * | 4/1990 | Traxler et al. | 363/65 |
| 5,168,438 | A | * | 12/1992 | Smith | 363/67 |
| 5,499,154 | A | * | 3/1996 | Cullison | 361/18 |
| 6,522,752 | B1 | * | 2/2003 | Smith | 381/61 |

* cited by examiner

*Primary Examiner*—Andrew Schechter
(74) *Attorney, Agent, or Firm*—White & Case, LLP

(57) ABSTRACT

A power supply for a guitar amplifier and the guitar amplifier and method of operating the guitar amplifier. The power supply includes an alternating current power input having a secondary winding and a filament winding, an output and a first vacuum tube rectifier coupled between the secondary winding of the power input and the output for rectifying the alternating current at the power input. At least a second rectifier is provided which is selectively couplable in parallel with the first vacuum tube rectifier. The at least one second rectifier can be a vacuum tube rectifier with each of the first and second rectifiers having a cathode continually energized by the filament winding, a solid state rectifier or both. The output amplifier has an output transformer having a primary winding with a center tap and with a first pair of vacuum tube amplifiers having their cathodes being coupled together and their plates coupled to the primary winding on opposite sides of the center tap. At least a second pair of vacuum tube amplifiers is provided having their cathodes coupled together and their plates being coupled to the primary winding on opposite sides of the center tap. A selector switch selectively causes at least one pair of the first pair of vacuum tube amplifiers and the at least a second pair of vacuum tube amplifiers to be operational and concurrently causes at least a selected one of the first vacuum tube rectifier and the at least a second rectifier to be operational corresponding to the selected at least one pair of vacuum tube amplifiers and the at least a second pair of vacuum tube amplifiers selected.

13 Claims, 2 Drawing Sheets

POWER SUPPLY FOR GUITAR AMPLIFIER

This application claims benefit to U.S. Provisional Application No. 60/361720 filed on Mar. 6, 2002.

BACKGROUND AND FIELD OF THE INVENTION

This invention relates to power supplies for guitar amplifiers and, more specifically, to power supplies for vacuum tube guitar amplifiers wherein a plurality of rectifier devices are automatically selected to operate in conjunction with varying power supply loads, as determined by the number of selectable output tubes in operation, to provide enhanced dynamic response under all performance conditions.

Electric guitar playing can be a tactile experience in addition to being an auditory experience. A properly configured amplifier and power supply can greatly enhance the dynamic playing experience by emphasizing impact and expressive nuance and "feeding it back" through the musician's ears such that the tactile sensation of playing is greatly enhanced. At their best, these enhance amplifier dynamics can provide the kind of inspiration musicians might call "black magic" because it enables them to actually play better. One important contributor to expressive dynamic response in a vacuum tube guitar amplifier is the voltage drop under variable musical demands of the high voltage power supply. The very notion of voltage drop in the power supply is counter to the prevailing concept which has always held that a stiff, well regulated power supply is essential for reducing all types of distortion and providing accurate amplifier response. However, electric guitar amplifiers may prove the exception to this rule because, as true musical instruments, their subjective characteristics often matter more than the purely objective and measurable ones for reasons as set forth hereinbelow.

The actual value of the high voltage itself exerts a notable influence on the "voice" of an amplifier, this is, the spread of harmonic emphasis that gives each note its timbre and contributes to the sonic identity of each amplifier design. Going a step further, an amplifier can be made to exhibit a mysterious twisting, morphing quality to the harmonic emphasis of even a single note, partly as a result of the changes occurring in power supply voltages. Before a note is plucked, the high-voltage filter capacitors in the power supply may be assumed to attain a state of full charge. At the instant the guitar string is plucked, the attack of the note will be emphasized as the filter capacitors unload their peak storage energy. Shortly thereafter, controlled voltage drop followed by voltage rebound can be made to occur. Taken as a whole, these power supply dynamics contribute notably to the complex twisting and morphing characteristic which can give a fine musical amplifier its elusive complexity and inspirational sound plus the enhanced tactile feel.

This has been a subject of great interest and has been the subject of prior U.S. Pat. No. 4,713,624 which teaches an amplifier with improved dynamic characteristics and U.S. Pat. No. 5,168,438 which describes selectable rectifier devices in an amplifier power supply and is more closely related to the subject invention. In should be understood that not all musical situations benefit from elastic, dynamic power supplies and to that end the alternative of switchable silicon diodes may at times be preferable to vacuum tube rectification, as specified in the above-noted '438 patent. The voltage drop across a silicon rectifier is a mere half volt and is unchanging under dynamic loads. In contrast, the vacuum tube rectifier may exhibit substantial voltage drop which can increase rather dramatically under the fluctuating load demands of the output amplifier. However, too much voltage drop would indicate a rectifier tube operating outside its safe parameters, whereas to little sag or drop would reduce the potential for enhancing dynamic response in a guitar amplifier. Therefore, the correct amount of voltage drop in the power supply can only be achieved by carefully matching the characteristics of the vacuum tube rectifier with the dynamic demands of the amplifier it serves. It must also be understood that voltage drop under dynamic conditions first requires a power amplifier which places varying current demands on the power supply. Thus, a Class A amplifier, with its steady current draw, is a very poor choice for this type of power supply refinement. Other less important elements may also contribute to the high voltage sag or drop under dynamic power conditions, notably the power transformer. Once again, though a transformer which, by itself, produced musically desirable dynamic characteristics, would probably run too hot for reliability.

Furthermore, the problems of properly matching power supply dynamics are exacerbated in amplifiers which offer the user a selection in the number and/or type of output tubes to be utilized. In the amplifier described in U.S. Pat. No. 5,559,479, different types of output power tubes may be operated individually or in various combinations to alter both the sonic character and the output capability. Thus, the switchable power amplifier characteristics of such an amplifier create the need to properly match power supply characteristics under all conditions.

SUMMARY OF THE INVENTION

In accordance with the present invention, the above noted improved characteristics are provided and there is provided a great enhancement to this type of amplifier as well as to any other amplifier which may offer user selection as to the number of operational output devices.

Briefly, there is provided rectifier tracking, the application of which is provided in amplifiers including selectability in the number and/or type of power tubes available for operation. A high voltage power supply is provided including a plurality of rectifier devices whose selectable operation may be governed automatically by the demands of the output amplifier. Thus, as varying numbers of power output tubes are selected for operation, the corresponding most appropriate rectifier type and quantity are simultaneously and automatically placed into service as well. In this way, optimal power supply and rectifier dynamics, according to the principle described above, is maintained under all conditions of the output amplifier.

DESCRIPTION OF THE PREFERRED EMBODIMENTS

Figure 1:
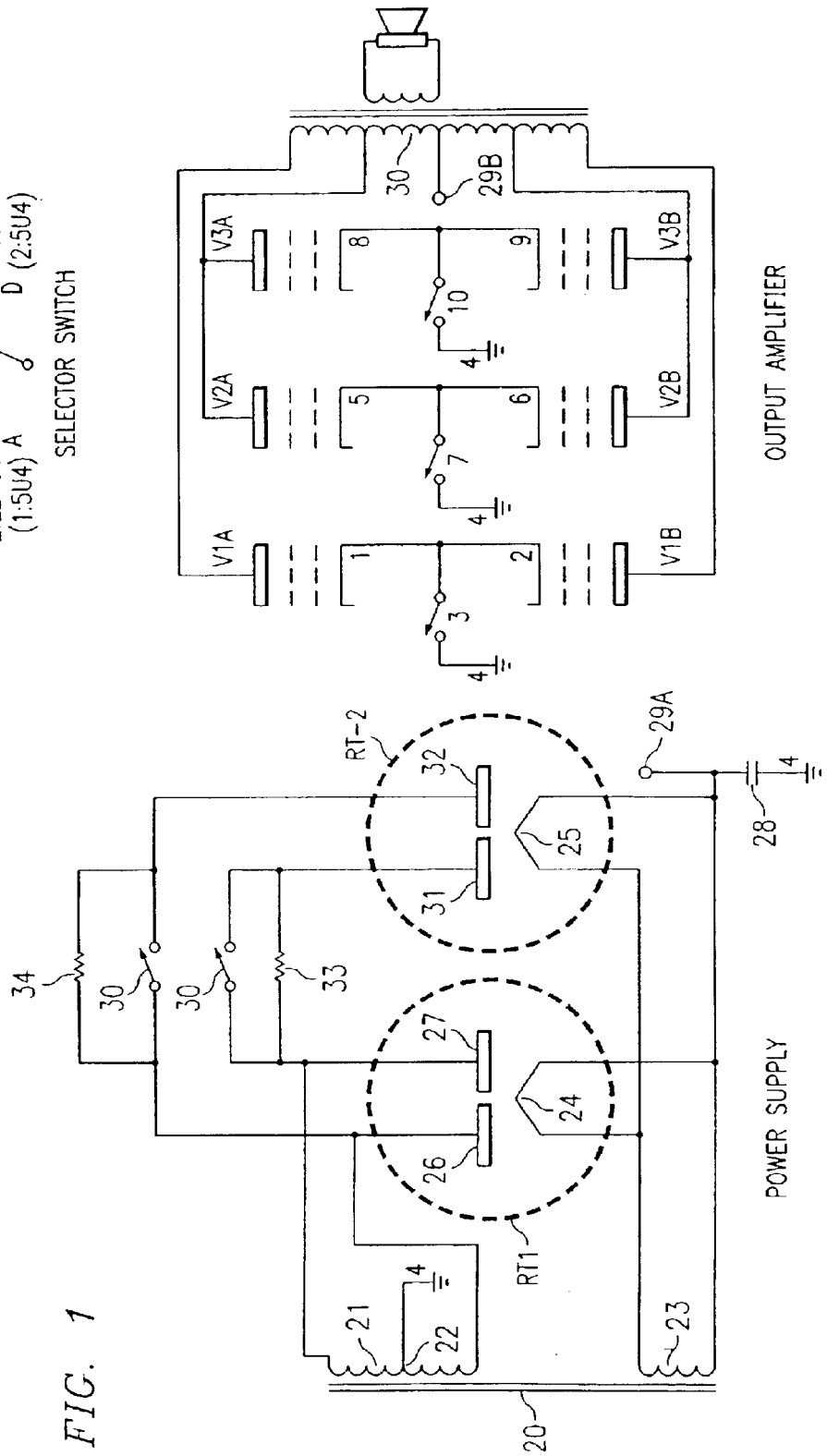
FIG. 1 is a schematic diagram of a preferred embodiment of a power supply, output amplifier and selector switch therefor in accordance with the present invention illustrating switchable vacuum tube rectifiers which track automatically in accordance with the selection of the tubes in the output amplifier.

Referring first to FIG. 1, there is shown a simplified schematic diagram of a power supply, output amplifier and selector switch therefore, the output amplifier having selectable power tubes and the power supply having selectable rectifiers. A first pair of push-pull output tubes are shown in the output amplifier at V1A and V1B with their cathodes 1 and 2 respectively tied together and coupled to a switch 3. When switch 3 is closed, as indicated by the broken line, continuity is made to ground and the first pair of output tubes becomes operational. For illustrative purposes, consider the first pair of tubes, V1A, V1B, to be type EL-34, though any of several different types could otherwise be used. A second pair of output tubes V2A and V2B have their cathodes 5 and 6 respectively tied together and may be turned on by switch 7. A third pair of output tubes V3A and V3B similarly have their cathodes 8 and 9 respectively tied together and coupled to switch 10 for activation. For illustrative purposes, the tubes V2A, V2B, V3A and V3B can be 6L6 type tubes. It follows that the first pair of tubes V1A, V1B are of one tube type, namely EL-34, the second pair of tubes V2A and V2B are of a second type, namely 6L6, and the third pair of tubes V3A and V3B are also of a second type (though they could also be of a third type or the first type), namely 6L6. The sonic characteristics of 6L6 and EL-34 tube types make an interesting contrast in a guitar output amplifier, the former being widely used throughout the United States while the latter was the British tube or valve (as it is called in Britain) of choice. A selector switch enables the user to select through any of the four possible choices, noted as A, B, C and D, for configuring the output tubes and each one of the choices has a distinct sound and power capability. As an alternative, the tubes could all be of a single type, though the sonic variation would then be limited relative to the above described embodiment.

With reference to the power supply, which is a principle subject of the present invention, there is provided a power transformer 20 which includes a high voltage secondary winding 21 with its center tap 22 connected to ground 4. The primary winding of transformer 20 is not shown. A pair of vacuum tube rectifiers RT-1 and RT-2 have their filaments 24 and 25 respectively connected to a low voltage filament winding 23 of the power transformer 20. For illustrative purposes, consider that both rectifier tubes RT-1 and RT-2 are type 5U4. As shown in FIG. 1, secondary high voltage alternating current is applied from opposing ends of the winding 21 to the plates 26, 27 of rectifier tube RT-1 while rectified current is supplied from the filament 24 of rectifier tube RT-1 to the main filter capacitor 28 and the power supply output terminal 29A. In accordance with standard practice, the main high voltage power supply output 29A is connected to the center tap of the output transformer primary winding 35 shown as center tap 29B of the output amplifier. Whenever the selector switch is calling for a single pair of output tubes, either 6L6 or EL-34, only this single rectifier device RT-1 is operative as shown twice by "1:5U4" of the selector switch, one for 6L6 tubes and the other for EL-34 tubes. If, however, the selector switch is set for either combination where a total of four output tubes are operative, then a second rectifier tube RT-2 is automatically switched into service as shown by "2:5U4" of the selector switch, one for a pair of 6L6 and a pair of EL-34 tubes and the second for two pairs of 6L6 tubes. This is accomplished via switch 30 which couples secondary high voltage alternating current from the winding 21 to the plates 31, 32 of rectifier tube RT-2. The filament 25 of the second rectifier tube RT-2 must be maintained in a warmed-up state to provide immediate additional total rectifier current when any combination of four output tubes is selected. Thus, switching of the RT-2 rectifier tube is achieved at its plates 31, 32 in contrast to the cathode switching of the pairs of output tubes of the output amplifier. A pair of high value resistors 33, 34 placed across the terminals of the switch 30 virtually eliminate the contact spark or arc which otherwise occurs during switching of rectifier tube RT-2 into operation in parallel with rectifier tube RT-1. The combined rectifying capacity of the parallel pair of vacuum tubes RT-1 and RT-2 provides the proper amount of power supply voltage drop for maintaining optimal dynamic performance and tactile feel.

In operation, with the selector switch set at position A, only rectifier tube RT-1 and output tubes V1A and V1B will be operational, thereby maintaining switch 30 open with switch member 3 being closed and switch members 7 and 10 being open. With the selector switch set at position B, only rectifier tube RT-1 and output tubes V2A and V2B will be operational, thereby maintaining switch 30 open with switch member 7 closed and switch members 3 and 10 open. With the selector switch set at position C, both rectifier tubes RT-1 and RT-2 as well as output tubes V1A, V1B and either V2A, V2B or V3A, V3B will be operational, thereby maintaining switch 30 closed with switch member 3 closed and either switch member 7 or 10 closed and the other open. With the selector switch set at position D, both rectifier tubes RT-1 and RT-2 as well as output tubes V2A, V2B and V3A, V3B will be operational, thereby maintaining switch 30 closed with switch members 7 and 10 closed and switch member 3 open.

Figure 2:
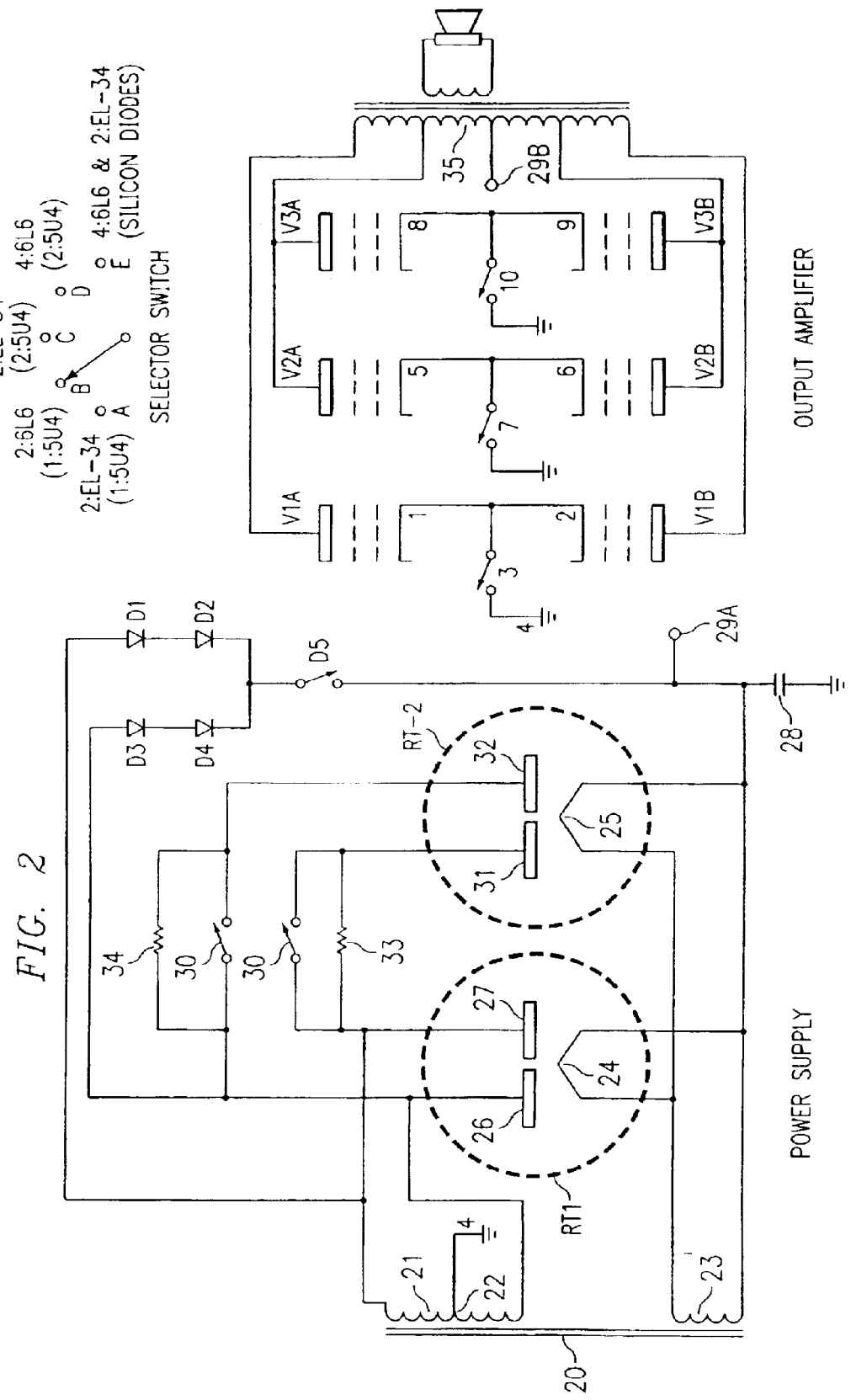
FIG. 2 is a schematic diagram of the preferred embodiment of FIG. 1 further including alternately selectable silicon diode rectifiers in a power supply which tracks automatically in accordance with the selection of tubes in the output amplifier.

Referring to FIG. 2, there is shown a circuit substantially the same as in FIG. 1 wherein all common parts share identical functions and identical character references. The circuit of FIG. 2 includes a preferred feature incorporated from the above noted U.S. Pat. No. 5,168,624, namely the alternate use of four silicon diode rectifiers D1, D2, D3 and D4 which, when coupled to the output terminal 29A and main filter capacitor 28 by switch D5, provide additional rectification capacity plus the dynamic alternative of a stiffened power supply. Note that the amplifier of FIG. 2, while including the same number of output tubes as that of FIG. 1, now provides a five position selector switch. The additional position offered in the circuitry of FIG. 2 is the combination of all six output tubes in simultaneous operation. The use of silicon diodes as the functional rectifier for this maximum combination is notable for two reasons. First, the two vacuum tube rectifiers RT-1 and RT-2 alone would be overstressed by the additional current demands of the output amplifier and the increased voltage drop through the rectifiers (RT-1 and RT-2) would largely offset any additional power advantage gained by operating all six output tubes simultaneously. Second, the contrast between the dynamics of the two types of rectifier devices, vacuum tube and silicon, is dramatically demonstrated by the automatic tracking feature of the present invention while at the same time providing the best match of power supply characteristics to an amplifier with selectable output tubes under all conditions.

In operation, the switch member D5 will be open in all positions of the selector switch except position E. With the selector switch set at position A, only rectifier tube RT-1 and output tubes V1A and V1B will be operational, thereby maintaining switch 30 open with switch member 3 being closed and switch members 7 and 10 being open. With the selector switch set at position B, only rectifier tube RT-1 and output tubes V2A and V2B will be operational, thereby maintaining switch 30 open with switch member 7 closed and switch members 3 and 10 open. With the selector switch set at position C, both rectifier tubes RT-1 and RT-2 as well as output tubes V1A, V1B and either V2A, V2B or V3A, V3B will be operational, thereby maintaining switch 30 closed with switch member 3 closed and either switch member 7 or 10 closed and the other open. With the selector switch set at position D, both rectifier tubes RT-1 and RT-2 as well as output tubes V2A, V2B and V3A, V3B will be operational, thereby maintaining switch 30 closed with switch members 7 and 10 closed and switch member 3 open.

With the selector switch in position E, both rectifier tubes RT-1 and RT-2 as well as silicon diodes D1, D2, D3 and D4 and output tubes V1A, V1B, V2A, V2B, V3A and V3B will be operational, thereby maintaining switch 30 closed as well as switch members D5, 3, 7 and 10 closed.

Though the invention has been described with reference to specific preferred embodiments thereof, many variations and modifications will immediately become apparent to those skilled in the art. For example, but not by way of limitation, the silicon diodes may be operated alternately to—or simultaneously with the vacuum tube rectifiers, there being no difference in performance. Likewise, some of the benefit of the improved power supply with rectifier tracking may be obtained by the use of power resistor(s) in place of the vacuum tube rectifier(s). Fewer or more output tubes and/or other rectifier or voltage drop devices could be used. The power supply could also be arranged to use a bridge rectifier rather than the full-wave, center-tapped configuration shown and perhaps, switch between the two. It is therefore the intention that the appended claims be interpreted as broadly as possible in view of the prior art.

What is claimed is:

1. A power supply for a guitar amplifier which comprises:
   (a) an alternating current power input having a secondary winding and a filament winding;
   (b) an output;
   (c) a first vacuum tube rectifier and coupled between said secondary winding of said power input and said output for rectifying said alternating current at said power input; and
   (d) at least a second rectifier selectively couplable with said first vacuum tube rectifier;
   wherein said second rectifier is a vacuum tube rectifier, each of said first and second rectifiers having a cathode continually energized by said filament winding.

2. The power supply of claim 1 further including a third vacuum tube rectifier, each of said first and third rectifiers having a cathode continually energized by said filament winding.

3. The power supply of claim 2 wherein said second rectifier is a solid state rectifier.

4. A guitar amplifier comprising:
   (a) a power supply having:
      (i) an alternating current power input having a secondary winding and a filament winding;
      (ii) an output;
      (iii) A first vacuum tube rectifier and coupled between said secondary winding of said power input and said output from rectifying said alternating current at said power input; and
      (iv) at least a second rectifier selectively couplable with said first vacuum tube rectifier;
   (b) an output amplifier having;
      (i) an output transformer having a primary winding with a center tap;
      (ii) a first pair of vacuum tube amplifiers, each having a plate and a cathode, the cathodes being coupled together and the plates being coupled to said primary winding on opposite sides of said center tap;
      (iii) at least a second pair of vacuum tube amplifiers, each having a plate and a cathode, the cathodes being coupled together and the plates being coupled to said primary winding on opposite sides of said center tap; and
   (c) a selector switch selectively causing at least one pair of said first pair of vacuum tube amplifiers and at least a second pair of vacuum tube amplifiers to be operational and concurrently causing at least a selected one of said first vacuum tube rectifier and said at least a second rectifier to be operational corresponding to the selected at least one pair of vacuum tube amplifiers and said at least a second pair of vacuum tube amplifiers selected.

5. The amplifier of claim 4 wherein said second rectifier is a vacuum tube rectifier, each of said first and second rectifiers having a cathode continually energized by said filament winding.

6. The amplifier of claim 4 wherein said second rectifier is a solid state rectifier.

7. The amplifier of claim 6 further including a third vacuum tube rectifier.

8. A method of controlling the operation of a guitar amplifier comprising the steps of:
   (a) providing a power supply having:
      (i) an alternating current power input having a secondary winding and a filament winding;
      (ii) an output;
      (iii) A first vacuum tube rectifier and coupled between said secondary winding of said power input and said output from rectifying said alternating current at said power input; and
      (iv) at least a second rectifier selectively couplable with said first vacuum tube rectifier;
   (b) providing an output amplifier having;
      (i) an output transformer having a primary winding with a center tap;
      (ii) a first pair of vacuum tube amplifiers, each having a plate and a cathode, the cathodes being coupled together and the plates being coupled to said primary winding on opposite sides of said center tap;
      (iii) at least a second pair of vacuum tube amplifiers, each having a plate and a cathode, the cathodes being coupled together and the plates being coupled to said primary winding on opposite sides of said center tap; and
   (c) selectively causing at least one pair of said first pair of vacuum tube amplifiers and said at least a second pair of vacuum tube amplifiers to be operational and concurrently causing at least a selected one of said first vacuum tube rectifier and said at least a second rectifier to be operational corresponding to the selected at least one pair of vacuum tube amplifiers and said at least a second pair of vacuum tube amplifiers selected.

9. The method of claim 8 wherein said second rectifier is a vacuum tube rectifier, each of said first and second rectifiers having a cathode continually energized by said filament winding.

10. The method of claim 8 wherein said second rectifier is a solid state rectifier.

11. The method of claim 10 further including a third vacuum tube rectifier, each of said first and third rectifiers having a cathode continually energized by said filament winding.

12. The amplifier of claim 6 wherein each of said first and third rectifiers having a cathode continually energized by said filament winding.

13. The amplifier of claim 7 wherein each of said first and third rectifiers having a cathode continually energized by said filament winding.

* * * * *